(12) United States Patent
Chen et al.

(10) Patent No.: US 12,027,084 B2
(45) Date of Patent: Jul. 2, 2024

(54) DISPLAY PANEL AND DISPLAY DEVICE

(71) Applicant: Shenzhen China Star Optoelectronics Semiconductor Display Technology Co., Ltd., Guangdong (CN)

(72) Inventors: Xiaoming Chen, Guangdong (CN); Peng Wan, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/424,187

(22) PCT Filed: Jul. 9, 2021

(86) PCT No.: PCT/CN2021/105503
§ 371 (c)(1),
(2) Date: Jul. 20, 2021

(87) PCT Pub. No.: WO2022/262028
PCT Pub. Date: Dec. 22, 2022

(65) Prior Publication Data
US 2024/0029600 A1    Jan. 25, 2024

(30) Foreign Application Priority Data
Jun. 15, 2021   (CN) .......................... 202110660484.2

(51) Int. Cl.
*G09G 3/00*      (2006.01)
*H01L 27/12*     (2006.01)

(52) U.S. Cl.
CPC .......... *G09G 3/006* (2013.01); *H01L 27/124* (2013.01)

(58) Field of Classification Search
CPC .............................. G09G 3/006; H01L 27/124
See application file for complete search history.

(56) References Cited

U.S. PATENT DOCUMENTS 9,208,710 B2 *  12/2015  Fukumoto ................ G09G 3/20
2002/0027621 A1   3/2002  Chae
2003/0117536 A1 *  6/2003  Jeon .................. G02F 1/136286
                                                                  349/40

(Continued)

FOREIGN PATENT DOCUMENTS

CN    101847641    9/2010
CN    102012593    4/2011
(Continued)

OTHER PUBLICATIONS

International Search Report and the Written Opinion dated Mar. 10, 2022 From the International Searching Authority Re. Application No. PCT/CN2021/105503 and Its Translation Into English. (16 Pages).

(Continued)

*Primary Examiner* — Antonio Xavier

(57) ABSTRACT

The present application provides a display panel including a first conductive layer, a second conductive layer, and a third conductive layer. The present application reduces an overlap area between test signal lines and data lines to further reduce a capacitance therebetween to prevent an issue of color mixture of a screen image during a lighting test.

16 Claims, 4 Drawing Sheets

(56) References Cited

U.S. PATENT DOCUMENTS

| | | | | |
|---|---|---|---|---|
| 2006/0244741 | A1* | 11/2006 | Kimura | G02F 1/13306 345/204 |
| 2007/0120457 | A1* | 5/2007 | Goh | H10K 50/805 313/463 |
| 2016/0064413 | A1* | 3/2016 | Cai | H01L 27/124 257/774 |
| 2019/0252636 | A1* | 8/2019 | Zhang | H10K 59/38 |
| 2020/0300906 | A1* | 9/2020 | Zhang | G02F 1/1362 |
| 2021/0223440 | A1* | 7/2021 | Wang | G02F 1/133502 |

FOREIGN PATENT DOCUMENTS

| | | |
|---|---|---|
| CN | 102708771 | 10/2012 |
| CN | 103855130 | 6/2014 |
| CN | 104571720 | 4/2015 |
| CN | 106935600 | 7/2017 |
| CN | 106960851 | 7/2017 |
| CN | 109597255 | 4/2019 |
| CN | 210224021 | 3/2020 |
| CN | 112117307 | 12/2020 |
| KR | 10-2007-0028646 | 3/2007 |

OTHER PUBLICATIONS

Notification of Decision of Rejection dated Mar. 29, 2023 From the State Intellectual Property Office of the People's Republic of China Re. Application No. 202110660484.2 and Its Translation Into English. (24 Pages).

Notification of Office Action and Search Report dated Jun. 6, 2022 From the State Intellectual Property Office of the People's Republic of China Re. Application No. 202110660484.2 and Its Translation Into English. (25 Pages).

Notification of Office Action dated Nov. 10, 2022 From the State Intellectual Property Office of the People's Republic of China Re. Application No. 202110660484.2 and Its Translation Into English. (24 Pages).

* cited by examiner

Direction of a display region

DISPLAY PANEL AND DISPLAY DEVICE

RELATED APPLICATIONS

This application is a National Phase of PCT Patent Application No. PCT/CN2021/105503 having International filing date of Jul. 9, 2021, which claims the benefit of priority of Chinese Patent Application No. 202110660484.2 filed on Jun. 15, 2021. The contents of the above applications are all incorporated by reference as if fully set forth herein in their entirety.

FIELD AND BACKGROUND OF THE INVENTION

The present application relates to a field of display technologies, especially to a display panel and a display device.

In conventional technology, when a motherboard of display panels is cut into individual display panels, a lighting test is often required to be performed to determine whether a screen image is abnormal.

Technical Issue

With reference to FIG. 1, in a conventional wiring design of a bonding region, all data signal lines 12 are in short-circuit with three individual test signal lines 11 (shorting bars). Such wiring layout design would lead to numerous overlap regions existing among the three shorting bars to generate a parasitic capacitance. The parasitic capacitance of the bonding region is equal to a total capacitance of data lines in a display region, such that a significant capacitive coupling phenomenon exists among shorting bars and leads to a color mixture phenomenon occurring on pure color screen images. An equivalent capacitance model among the data lines is shown in FIG. 2. Cbb refers to a capacitance among shorting bars, and Caa refers to a total capacitance of the data lines in the display region. Taking a display panel of type No. 22605 as an example, Cbb=125 pF, Caa=147 pF, assuming that a voltage of a color filter substrate CF is 7V and a voltage of Dn is 7V, at a moment when a voltage of Dn+1 switched from 7V to 14V, charge coupling effect occurs, and the voltage of Dn is raised to voltage Vcp=Cbb/(Cbb+Caa)*7+7=10.2V. The voltage can lead to pixels corresponding to Dn being lighted to further result in a color mixture phenomenon occurring on pure color screen images. Because of influence of the above mechanism, when 22605 lights up green (G) screen images or blue (B) screen images, red (R) sub-pixels are lighted up. When the green (G) screen images are shown, in the red (R) sub-pixels, the sub-pixels of even columns are lighted up. Under the blue (B) screen image, the red (R) sub-pixels of odd columns are lighted up. Under the red (R) screen images, green (G) or blue (B) sub-pixels are lighted up. The color mixture phenomenon can be prevented by lowering the voltage of the data lines. However, after the voltage of the data lines is lowered, a charge rate may be overly low and result in split screen images or an intensified uneven display phenomenon.

To solve the above difficulty, a display panel is set forth now to overcome the existing issue in the conventional technology.

SUMMARY OF THE INVENTION

Technical Solution

An objective of the present application is to provide a display panel and a display device that reduce a capacitance between test signal lines and data lines to further prevent an issue of color mixture of a screen image during a lighting test.

The present application provides a display panel, divided into a display region and a non-display region, and the display panel comprises: a substrate; a first conductive layer disposed on the substrate, wherein the first conductive layer comprises a plurality of test signal lines along a first direction, and the test signal lines are located in the non-display region and configured to implement a lighting test; a second conductive layer disposed insulatively above the first conductive layer, wherein the second conductive layer comprises a plurality of data lines along a second direction, and the data lines are located in the display region; and a third conductive layer disposed above the first conductive layer and the second conductive layer, and configured to connect the data lines and the test signal lines; wherein a projection of each of the data lines on a plane where the first conductive layer is located has no overlap with each of the test signal lines; or wherein the data lines extend from the display region to the non-display region, the projections of the data lines on the plane where the first conductive layer is located overlap with the test signal lines to form a plurality of overlap regions, and a width of each of the test signal lines in the overlap region is less than a width of each of the test signal lines outside the overlap region.

Furthermore, in the overlap regions, first notches are defined in two sides of the test signal line.

Furthermore, a shape of a projection of the first notch on the plane where the first conductive layer is located comprises at least one of arc, rectangular, trapezoidal, triangular, or wave.

Furthermore, in the overlap regions, second notches are defined in two sides of the data line.

Furthermore, a shape of a projection of the second notch on the plane where the first conductive layer is located comprises at least one of arc, rectangular, trapezoidal, triangular, or wave.

Furthermore, the display panel further comprises: a first insulation layer disposed between the first conductive layer and the second conductive layer; and a passivation layer disposed between the first insulation layer and covering the second conductive layer.

Furthermore, the passivation layer comprises: a first via hole defined through the passivation layer and the first insulation layer and arranged oppositely to one of the test signal lines; and a second via hole defined through the passivation layer and arranged oppositely to one of the data lines; wherein the third conductive layer is disposed on the passivation layer, extends to and covers a hole wall of the first via hole and an upper surface of the test signal line, and extends to and covers a hole wall of the second via hole and an upper surface of the data line.

Furthermore, the display panel further comprises an elevation layer disposed between the third conductive layer and the passivation layer, wherein material of the elevation layer is insulative material.

Furthermore, the elevation layer is disposed in the same layer where a black matrix or a color resist layer is disposed, and material of the elevation layer is the same as material of the black matrix or the color resist layer.

Furthermore, the third conductive layer comprises a plurality of signal lines, first ends of the signal lines are located in the non-display region, and are connected to the test signal lines; when the projections of the data lines on the plane where the first conductive layer is located overlap with the test signal lines, second ends of the signal lines are located in the non-display region, and are connected to the data lines; and when the projections of the data lines on the plane where the first conductive layer is located has no overlap with the test signal lines, the second ends of the signal lines extend into the display region, and are connected to the data lines.

The present application further provides a display device comprising the display panel of the present application.

Advantages

The present application provides a display panel and a display device that reduce a capacitance value of a parasitic capacitance formed by data lines and test signal lines by reducing a relative area of the data lines and the test signal lines to further prevent an issue of color mixture of a screen image from occurring on the display panel during a lighting test to the display panel.

BRIEF DESCRIPTION OF THE SEVERAL VIEWS OF THE DRAWINGS

Specific embodiments of the present invention are described in details with accompanying drawings as follows to make technical solutions and advantages of the present invention clear.

Figure 1:
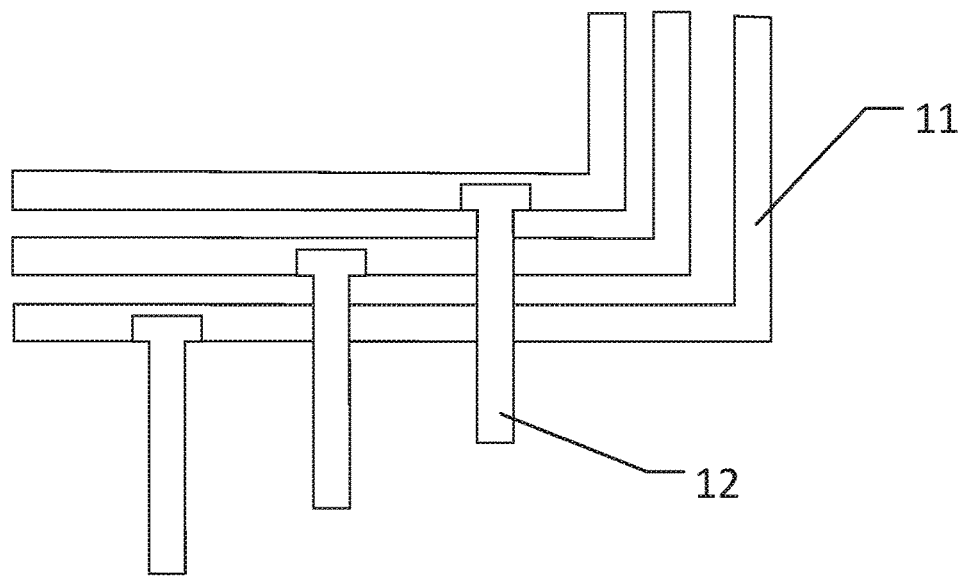
FIG. 1 is a schematic view of wiring of a bonding region of a conventional display panel.
Figure 2:
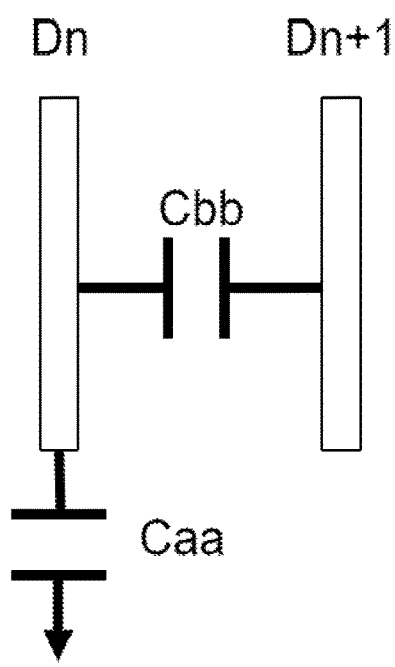
FIG. 2 is a schematic view of an equivalent capacitance model among data lines of the conventional display panel.

test signal lines 101; data lines 102; substrate 103; first insulation layer 104; passivation layer 105;
first conductive layer 110; second conductive layer 120;
third conductive layer 130;
first via hole 131; second via hole 132.

DESCRIPTION OF SPECIFIC EMBODIMENTS OF THE INVENTION

The technical solution in the embodiment of the present application will be clearly and completely described below with reference to the accompanying drawings in the embodiments of the present application. Apparently, the described embodiments are merely some embodiments of the present application instead of all embodiments.

First Embodiment

Figure 3:
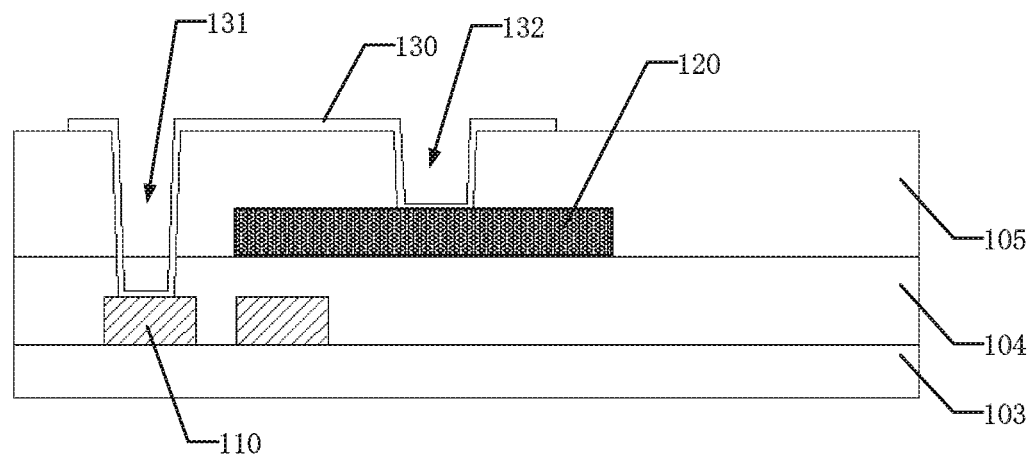
FIG. 3 is a schematic structural view of a display panel of a first embodiment of the present application.
Figure 4:
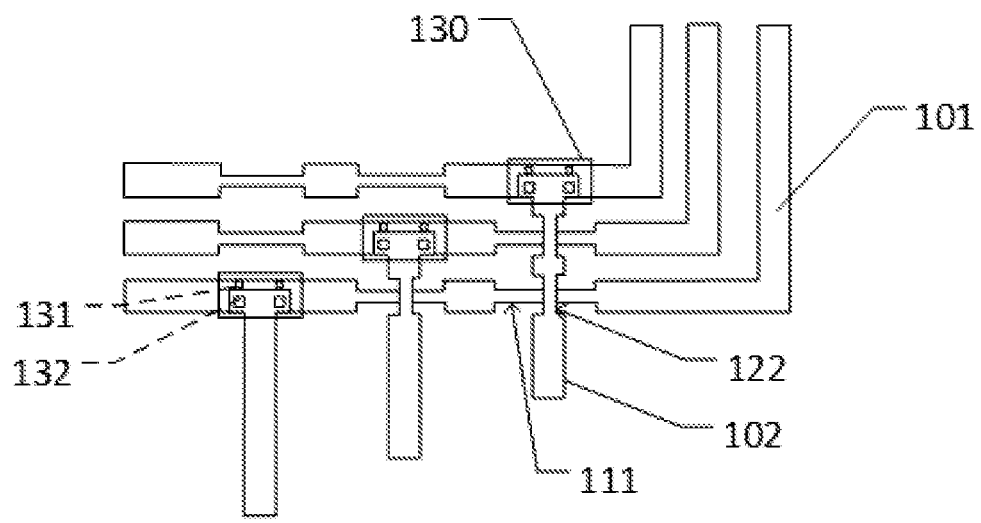
FIG. 4 is a schematic view of data lines and test signal lines of the display panel of the first embodiment of the present application.

With reference to FIGS. 3 and 4, the first embodiment of the present application provides a display device, and the display device comprises a display panel. The display panel is divided into a display region and a non-display region. The display panel comprises a substrate 103, a first conductive layer 110, a second conductive layer 120, a third conductive layer 130, a first insulation layer 104, and a passivation layer 105.

The first conductive layer 110 is disposed on the substrate 103. The first conductive layer 110 comprises a plurality of test signal lines 101 disposed along a first direction. The test signal lines 101 are located in the non-display region for achieving a lighting test to the display panel. In the present embodiment, the first conductive layer 110 and a gate electrode layer of the display region are manufactured simultaneously so no unnecessary manufacturing works are added.

The first insulation layer 104 is disposed on the substrate 103 and covers the first conductive layer 110. The first insulation layer 104 is a gate electrode insulation layer, and material thereof comprises silicon nitride or silica.

The second conductive layer 120 is disposed insulatively above the first conductive layer 110, and the second conductive layer 120 comprises a plurality of data lines 102 disposed along a second direction, the data lines 102 are located in the display region, and the first direction intersects the second direction. In the present embodiment, the first direction is perpendicular to the second direction, the first direction is a lateral direction, and the second direction is a longitudinal direction.

In the present embodiment, the data lines 102 extend from the display region to the non-display region. A projection of the data lines 102 on a plane where the first conductive layer 110 is located overlaps with the test signal lines 101 to form a plurality of overlap regions. A width of the overlap region along the first direction is greater than or equal to a width of the data line 102. A width of the overlap region along the second direction is greater than or equal to a width of the test signal line 101.

In the present embodiment, a width of the test signal line 101 in the overlap region is less than a width of the test signal line 101 outside the overlap region. Specifically, in the overlap regions, first notches 111 are defined in two sides of the test signal line 101. A shape of a projection of the first notch 111 on the plane where the first conductive layer 110 is located comprises at least one of arc, rectangular, trapezoidal, triangular, or wave. In the present embodiment, the shape of the first notches 111 is round trapezoidal, which can prevent the test line from being broken to further prevent a short circuit phenomenon.

In the present embodiment, a width of the data line 102 in the overlap region is less than a width of the data line 102 outside the overlap region. Specifically, in the overlap region, second notches 122 are defined in two sides of the data line 102. A shape of a projection of the second notch 122 on the plane where the first conductive layer is located comprises at least one of arc, rectangular, trapezoidal, triangular, or wave. In the present embodiment, the shape of the second notch 122 is round trapezoidal, which can prevent the data lines from being broken to further prevent a short circuit phenomenon.

The passivation layer 105 is a passivation layer, and is disposed on the first insulation layer 104 and covers the second conductive layer 120. Specifically, the passivation layer 105 comprises a first via hole 131 and a second via hole 132. The first via hole 131 is defined downward through the passivation layer 105 and a portion of the first insulation layer 104 and extends to an upper surface of the first conductive layer 110, and the second via hole 132 is defined downward through a portion of the passivation layer 105 and extends to an upper surface of the second conductive layer 120.

The third conductive layer 130 is disposed on the passivation layer 105, extends to and covers a hole wall of the first via hole 131 and upper surfaces of the test signal lines 101, and extends to and covers a hole wall of the second via hole 132 and upper surfaces of the data lines 102. The third conductive layer 130 is configured to connect the first conductive layer 110 to the second conductive layer 120. The third conductive layer 130 comprises a plurality of signal lines. First ends of the signal lines are located in the non-display region and are connected to the test signal lines 101. In the present embodiment, the data lines 102 extend from the display region to the non-display region, and a projection of the data lines 102 on the plane where the first conductive layer 110 is located overlaps with the test signal lines 101. Second ends of the signal lines are located in the non-display region and are connected to the data lines 102.

According to a capacitance calculation formula $C=\varepsilon S/d$ ($\varepsilon$ refers to a dielectric constant of medium between electrode plates, S refers to a relative area of two oppositely disposed electrode plates, d refers to a distance between the electrode plates), the smaller the relative area S is, the smaller the capacitance C is. In the first embodiment, a projection of the data line 102 on the first conductive layer 110 intersects the test signal line 101. A portion of the data lines 102 is disposed opposite to a portion of the test signal line 101 to form a parasitic capacitance, which is inevitable. The first insulation layer 104 exists between the data lines 102 and the test signal lines 101, is silicon nitride or silica, and has a dielectric constant which is unchanging. The present embodiment makes the relative area S of the data lines 102 and the test signal lines 101 smaller by reducing the widths of the data lines 102 and the test signal lines 101 in the overlap regions to reduce the capacitance value of the capacitance formed by the data lines 102 and the test signal lines 101 to further prevent the issue of color mixture of a screen image of the display panel during the lighting test.

Second Embodiment

Figure 5:
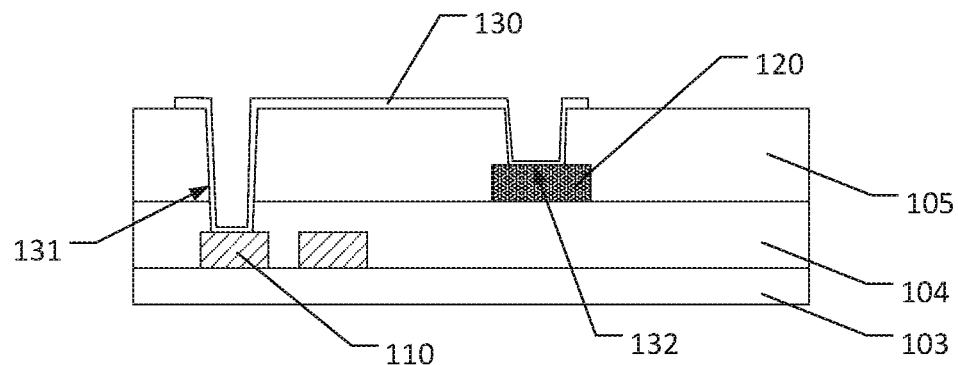
FIG. 5 is a schematic structural view of a display panel of a second embodiment of the present application.
Figure 6:
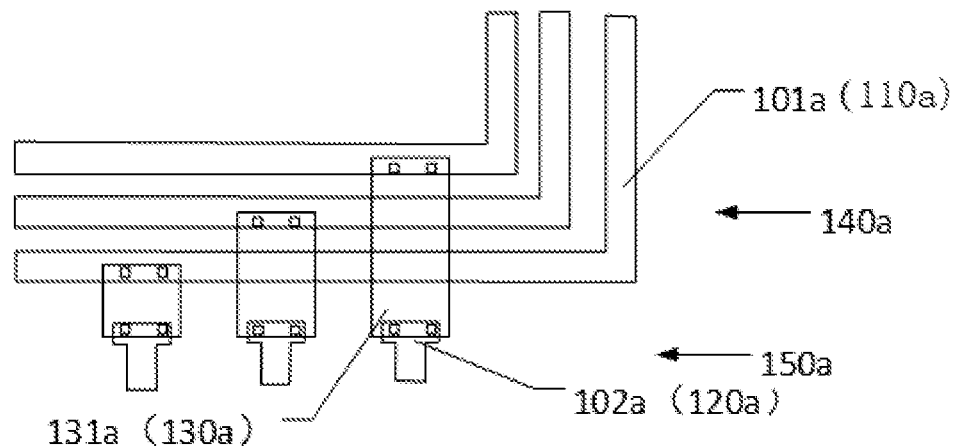
FIG. 6 is a schematic view of data lines and test signal lines of the display panel of the second embodiment of the present application.

With reference to FIGS. 5 and 6, the second embodiment of the present application provides a display panel, comprising most of the technical solutions of the first embodiment, and a difference of the second embodiment from the first embodiment is that the projection of the data line 102a on the plane where the first conductive layer 110a is located does not overlap with the test signal line 101a (i.e., no intersection), and both are not disposed opposite to each other. The data lines 102a are moved out of the non-display region 140a to prevent direct formation of capacitance by the data lines 102a and the test signal lines 101a.

The data lines 102a are disposed in the display region 150a, and the test signal lines 101a are disposed in the non-display region. A third conductive layer 130a is disposed on a connection portion between the display region 150a and the non-display region 140a, an end of the third conductive layer 130a is connected to the test signal lines 101a, and another end of the third conductive layer 130a is connected to the data lines 102a. The data lines 102a have no need to be directly connected to the test signal lines 101a, but are indirectly connected to the test signal lines 101a through the third conductive layer 130a such that the data lines have no need to cross any one of the test signal lines 101a, which further prevents the data lines 102a from overlapping with the test signal lines 101a in the projection of the first conductive layer 110a to further prevent both from forming a parasitic capacitance.

Specifically, the third conductive layer 130a is disposed above the second conductive layer 120a. The third conductive layer 130a comprises a plurality of signal lines 131a, an end of the signal line 131a is connected to the test signal lines 101a, and another end of the signal line is connected to the data lines 102a.

A projection of the third conductive layer 130a on the first conductive layer 110a overlaps with the test signal lines, and a parasitic capacitance is formed between the third conductive layer 130a and the first conductive layer 110a. The first insulation layer 104 and the passivation layer 105 exist between the third conductive layer 130a and the first conductive layer 110a, dielectric constants of both are similar, but a ratio of a thickness of the passivation layer 105 to a thickness of the first insulation layer 104 is 1 to 4, and a ratio of a distance between the third conductive layer 130a and the first conductive layer 110a to a ratio of a distance between the second conductive layer 132a and the first conductive layer 110a is about 2 to 5.

According to a capacitance calculation formula $C=\varepsilon S/d$ ($\varepsilon$ is a dielectric constant of medium between electrode plates, S refers to a relative area of two oppositely disposed electrode plates, d is a distance between the electrode plates), it can be known that the greater the distance d between the electrode plates is, the smaller the capacitance C is. In the second embodiment, the data lines 102a are moved out of the non-display region, no overlap region exists between the data lines 102a and the test signal lines 101a to prevent a capacitance formed by the data lines 102a and the test signal lines 101a. A parasitic capacitance formed by the third conductive layer 130a and the first conductive layer 110a would be less than that of the conventional technology to prevent the issue of color mixture of a screen image of the display panel during the lighting test.

Third Embodiment

Figure 7:
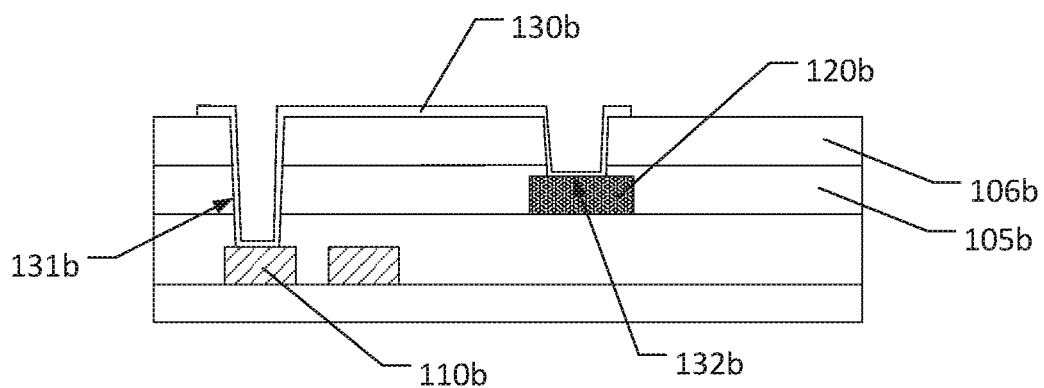
FIG. 7 is a schematic structural view of a display panel of a third embodiment of the present application.

With reference to FIG. 7, the third embodiment of the present application provides a display panel comprising most of the technical solutions of the second embodiment, and a difference thereof from the second embodiment is that the display panel further comprises an elevation layer 106b, the elevation layer 106b is disposed between the passivation layer 105b and the third conductive layer 130b, material of the elevation layer 106b is insulative material, and a dielectric constant of the elevation layer 106b is similar to that of the passivation layer 105b. The elevation layer 106b can be disposed in the same layer as the black matrix or the color resist layer, and material of the elevation layer 106b can be the same as material of the black matrix or the color resist layer. During manufacturing the display panel, a manufacturer can manufacture the elevation layer in the same process of manufacturing the black matrix layer or the color resist layer without increasing cost. A simulation result indicates that when the elevation layer uses the R color resist, the capacitance C between the shorting bars can be lowered from 125 pF to 10 pF, and a reduction amplitude exceeds 90%.

The elevation layer 106b is configured to increase a thickness of the insulation layer. A capacitance formed by the third conductive layer 130b and the first conductive layer 110b is inversely proportional to the thickness of the insulation layer. Therefore, the greater the thickness of the insulation layer is, the less the capacitance is. The elevation layer 106b comprises a first via hole 131b and a second via hole 132b, the first via hole 131b is defined downward through the elevation layer 106b, the passivation layer 105, and a portion of the first insulation layer 104b to an upper surface of the first conductive layer 110b, and the second via hole 132b is defined downward through the elevation layer 106b and a portion of the passivation layer 105 and extends to an upper surface of the second conductive layer 120b.

As described above, the present application provides three embodiments to reduce parasitic capacitance between the test signal lines 101 and the data lines 102 or the third conductive layer 130 to further prevent an issue of color mixture of a screen image during the lighting test. The first embodiment reduces an overlapping area between the test signal lines 101 and the data lines 102 to further reduce capacitance therebetween. The second embodiment disposes the data lines 102 in the display region, and it connects by disposing the third conductive layer 130 in the non-display region without directly being disposed opposite to the test signal lines 101, which further prevents overlap between the test signal lines 101 and data lines 102 projection and reduces the capacitance therebetween. The third embodiment prevents overlap between the test signal lines 101 and the data lines 102 projection, reduces the capacitance between the test signal lines 101 and the data lines 102, and simultaneously disposes the elevation layer for increasing a thickness of the insulation layer, namely increasing a distance between the test signal lines 101 and the signal lines of the third conductive layer 130 to further reduce the capacitance between the test signal lines 101 and the signal lines of the third conductive layer 130.

In other embodiment, the present application can also combine the first embodiment and the third embodiment and combine the second embodiment and the third embodiment to further reduce the capacitance of the test signal lines 101 overlapping with the data lines 102.

The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A display panel, divided into a display region and a non-display region, and the display panel comprising:
   a substrate;
   a first conductive layer disposed on the substrate, wherein the first conductive layer comprises a plurality of test signal lines along a first direction, and the test signal lines are located in the non-display region and configured to implement a lighting test;
   a second conductive layer disposed insulatively above the first conductive layer, wherein the second conductive layer comprises a plurality of data lines along a second direction, and the data lines are located in the display region; and
   a third conductive layer disposed above the first conductive layer and the second conductive layer, and configured to connect the data lines and the test signal lines;
   wherein a projection of each of the data lines on a plane where the first conductive layer is located has no overlap with each of the test signal lines; or
   wherein the data lines extend from the display region to the non-display region, the projections of the data lines on the plane where the first conductive layer is located overlap with the test signal lines to form a plurality of overlap regions, and a width of each of the test signal lines in the overlap regions is less than a width of each of the test signal lines outside the overlap regions;
   wherein the display panel further comprises:
   a first insulation layer disposed between the first conductive layer and the second conductive layer; and
   a passivation layer covering the second conductive layer;
   wherein the display panel further comprises an elevation layer disposed between the third conductive layer and the passivation layer, wherein a material of the elevation layer is an insulative material.

2. The display panel according to claim 1, wherein in the overlap regions, first notches are defined in two sides of the test signal lines.

3. The display panel according to claim 2, wherein a shape of a projection of the first notches on the plane where the first conductive layer is located comprises at least one of arc, rectangular, trapezoidal, triangular, or wave.

4. The display panel according to claim 1, wherein in the overlap regions, second notches are defined in two sides of the data lines.

5. The display panel according to claim 4, wherein a shape of a projection of the second notches on the plane where the first conductive layer is located comprises at least one of arc, rectangular, trapezoidal, triangular, or wave.

6. The display panel according to claim 1, wherein the passivation layer comprises:
   a first via hole defined through the passivation layer and the first insulation layer and arranged oppositely to one of the test signal lines; and
   a second via hole defined through the passivation layer and arranged oppositely to one of the data lines;
   wherein the third conductive layer is disposed on the passivation layer, extends to and covers a hole wall of the first via hole and an upper surface of the test signal line, and extends to and covers a hole wall of the second via hole and an upper surface of the data line.

7. The display panel according to claim 1, wherein the elevation layer is disposed in a same layer as a black matrix or a color resist layer, and the material of the elevation layer is same as a material of the black matrix or the color resist layer.

8. The display panel according to claim 1, wherein
   the third conductive layer comprises a plurality of signal lines, first ends of the signal lines are located in the non-display region, and are connected to the test signal lines;
   when the projections of the data lines on the plane where the first conductive layer is located overlap with the test signal lines, second ends of the signal lines are located in the non-display region, and are connected to the data lines; or
   when the projections of the data lines on the plane where the first conductive layer is located has no overlap with the test signal lines, the second ends of the signal lines extend into the display region, and are connected to the data lines.

9. A display device, comprising a display panel;
   wherein the display panel is divided into a display region and a non-display region, and the display panel comprises:
   a substrate;
   a first conductive layer disposed on the substrate, wherein the first conductive layer comprises a plurality of test signal lines along a first direction, and the test signal lines are located in the non-display region and configured to implement a lighting test;

a second conductive layer disposed insulatively above the first conductive layer, wherein the second conductive layer comprises a plurality of data lines along a second direction, and the data lines are located in the display region; and a third conductive layer disposed above the first conductive layer and the second conductive layer; and configured to connect the data lines and the test signal lines;

wherein a projection of each of the data lines on a plane where the first conductive layer is located has no overlap with each of the test signal lines; or wherein the data lines extend from the display region to the non-display region, the projections of the data lines on the plane where the first conductive layer is located overlap with the test signal lines to form a plurality of overlap regions, and a width of each of the test signal lines in the overlap regions is less than a width of each of the test signal lines outside the overlap regions;

wherein the display panel further comprises:

a first insulation layer disposed between the first conductive layer and the second conductive layer; and a passivation layer covering the second conductive layer;

wherein the display panel further comprises an elevation layer disposed between the third conductive layer and the passivation layer, wherein a material of the elevation layer is an insulative material.

10. The display device according to claim 9, wherein in the overlap regions, first notches are defined in two sides of the test signal lines.

11. The display device according to claim 10, wherein a shape of a projection of the first notches on the plane where the first conductive layer is located comprises at least one of arc, rectangular, trapezoidal, triangular, or wave.

12. The display device according to claim 9, wherein in the overlap regions, second notches are defined in two sides of the data lines.

13. The display device according to claim 12, wherein a shape of a projection of the second notches on the plane where the first conductive layer is located comprises at least one of arc, rectangular, trapezoidal, triangular, or wave.

14. The display device according to claim 9, wherein the passivation layer comprises:

a first via hole defined through the passivation layer and the first insulation layer and arranged oppositely to one of the test signal lines; and a second via hole defined through the passivation layer and arranged oppositely to one of the data lines;

wherein the third conductive layer is disposed on the passivation layer, extends to and covers a hole wall of the first via hole and an upper surface of the test signal line, and extends to and covers a hole wall of the second via hole and an upper surface of the data line.

15. The display device according to claim 9, wherein the elevation layer is disposed in the same layer where a black matrix or a color resist layer is disposed, and the material of the elevation layer is the same as material of the black matrix or the color resist layer.

16. The display device according to claim 9, wherein the third conductive layer comprises a plurality of signal lines, first ends of the signal lines are located in the non-display region, and are connected to the test signal lines;

when the projections of the data lines on the plane where the first conductive layer is located overlap with the test signal lines, second ends of the signal lines are located in the non-display region, and are connected to the data lines; or when the projections of the data lines on the plane where the first conductive layer is located has no overlap with the test signal lines, the second ends of the signal lines extend into the display region, and are connected to the data lines.

\* \* \* \* \*